US00RE42273E

(19) United States
(12) Reissued Patent
Nathan et al.

(10) Patent Number: US RE42,273 E
(45) Date of Reissued Patent: Apr. 5, 2011

(54) MICRO ELECTROCHEMICAL ENERGY STORAGE CELLS

(75) Inventors: Menachem Nathan, Tel Aviv (IL); Emanuel Peled, Even Yehuda (IL); Dan Haronian, Efrat (IL)

(73) Assignee: Ramot At Tel-Aviv University Ltd., Tel-Aviv (IL)

(21) Appl. No.: 12/834,498
(22) Filed: Jul. 12, 2010

Related U.S. Patent Documents

Reissue of:
(64) Patent No.: 6,197,450
Issued: Mar. 6, 2001
Appl. No.: 09/176,321
Filed: Oct. 22, 1998

U.S. Applications:
(62) Division of application No. 11/866,722, filed on Oct. 3, 2007, now Pat. No. Re. 41,578, which is a division of application No. 10/382,466, filed on Mar. 6, 2003.

(51) Int. Cl.
*H01M 6/42* (2006.01)
*H01M 4/76* (2006.01)
*H01M 6/18* (2006.01)
*H01M 4/40* (2006.01)

(52) U.S. Cl. ..... 429/236; 429/304; 429/231.1; 29/623.1

(58) Field of Classification Search ..... None
See application file for complete search history.

(56) References Cited

U.S. PATENT DOCUMENTS

| | | | |
|---|---|---|---|
| 4,173,745 | A | 11/1979 | Saunders |
| 4,659,637 | A | 4/1987 | Nelson et al. |
| 4,822,701 | A | 4/1989 | Ballard et al. |
| 4,878,094 | A | 10/1989 | Balkanski |
| 4,906,536 | A | 3/1990 | Simonton |
| 5,019,468 | A | 5/1991 | Miyabayashi |
| 5,162,178 | A | 11/1992 | Ohsawa et al. |
| 5,187,564 | A | 2/1993 | McCain |
| 5,338,625 | A | 8/1994 | Bates et al. |
| 5,421,083 | A | 6/1995 | Suppelsa et al. |
| 5,545,308 | A | 8/1996 | Murphy et al. |
| 5,567,210 | A | 10/1996 | Bates et al. |
| 5,672,446 | A | 9/1997 | Barker et al. |
| 5,916,514 | A | 6/1999 | Eshraghi |
| 6,025,094 | A | 2/2000 | Visco et al. |
| 6,197,450 | B1 | 3/2001 | Nathan et al. |
| 6,264,709 | B1 | 7/2001 | Yoon et al. |
| 6,270,714 | B1 | 8/2001 | Azran et al. |

FOREIGN PATENT DOCUMENTS

| | | | |
|---|---|---|---|
| EP | 0331342 | A2 | 9/1989 |
| EP | 0 331 3342 | | 9/1989 |
| FR | 2550015 | A1 | 2/1985 |
| FR | 2 550 015 | | 2/1985 |
| FR | 2606207 | A1 | 5/1988 |
| FR | 2 606 207 | | 5/1988 |
| FR | 2621174 | A1 | 3/1989 |
| FR | 2 621 174 | | 3/1989 |
| GB | 2161988 | A | 1/1986 |
| GB | 2 161 988 | | 1/1986 |
| JP | 2168560 | A | 6/1990 |

OTHER PUBLICATIONS

Lehmann et al., "A novel capacitor technology based on porous silicon" Thin Solid Films, vol. 276, Issue 1–2, p. 138–142 (1996).

Owen, "Ionically conducting glasses", Solid State Batteries, Sequiera and Hooper, Nato Science Series E, Springer, Oct. 1985.

Patent Abstracts Of Japan, Publication No. 091186461, Publication Date Jul. 15, 1997.

*Primary Examiner*—Keith Walker
(74) *Attorney, Agent, or Firm*—Browdy and Neimark, PLLC

(57) ABSTRACT

Thin-film micro-electrochemical energy storage cells (MEESC) such as microbatteries and double-layer capacitors (DLC) are provided. The MEESC comprises two thin layer electrodes, an intermediate thin layer of a solid electrolyte and optionally, a fourth thin current collector layer; said layers being deposited in sequence on a surface of a substrate. The MEESC is characterized in that the substrate is provided with a plurality of through cavities of arbitrary shape, with high aspect ratio. By using the substrate volume, an increase in the total electrode area per volume is accomplished.

20 Claims, 2 Drawing Sheets

MICRO ELECTROCHEMICAL ENERGY STORAGE CELLS

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 6,197,450. The reissue applications are application Ser. Nos. 10/382,466 and 11/866,722 and this application, which is a division of application Ser. Nos. 10/382,466 and 11/866,722, for reissue of U.S. Pat. No. 6,197,450.*

FIELD OF THE INVENTION

This invention relates to thin film micro-electrochemical energy storage cells (MEESC), such as microbatteries and double-layer capacitors (DLC).

BACKGROUND OF THE INVENTION

Advances in electronics have given us pocket calculators, digital watches, heart pacemakers, computers for industry, commerce and scientific research, automatically controlled production processes and a host of other applications.

These have become possible largely because we have learned how to build complete circuits, containing millions of electronic devices, on a tiny wafer of silicon no larger than 25–40 mm square and 0.4–0.5 mm thick. Microelectronics is concerned with these miniaturized integrated circuits (ICs), or "chips" as they are called. In a circuit, electrical energy is supplied from, for example, a microbattery or a double-layer capacitor (DLC) and is changed into other forms of energy by appliances in the circuit, which have resistance.

Recently, with the tendency of miniaturizing of small-sized electronic devices, there have been developed thin-film microbatteries, which have several advantages over conventional batteries, since battery cell components can be prepared as thin (1–20 μm) sheets built up as layers. Usually, such thin layers of the cathode, electrolyte and anode are deposited using direct-current and radiofrequency magnetron sputtering or thermal evaporation.

The area and thickness of the sheets determine battery capacity and there is a need to increase the total electrode area in a given volume. Thin films result in higher current densities and cell efficiencies because the transport of ions is easier and faster through thin-film layers than through thick layers.

U.S. Pat. Nos. 5,338,625 and 5,567,210 describe thin-film lithium cells, especially thin-film microbatteries having application as backup or primary integrated power sources for electronic devices and method for making such. The batteries described in these references are assembled from solid state materials, and can be fabricated directly onto a semiconductor chip, the chip package or the chip carrier. These batteries have low energy and power. They have an open circuit voltage at full charge of 3.7–4.5 V and can deliver currents of up to 100 $\mu A/cm^2$. The capacity of a 1 square cm microbattery is about 130 μA/hr. These low values make these batteries useful only for very low power requirements in some microelectronic circuits.

A double-layer capacitor (DLC), as opposed to a classic capacitor, is made of an ion conductive layer between two electrodes. In order to make an electric double-layer capacitor smaller and lighter without any change in its capacitance, it is necessary to increase the energy. This may be accomplished, for example, as described in U.S. Pat. No. 5,754,393, by increasing the working voltage by use of an electrolyte having a high decomposition voltage.

Advanced etching technologies, such as reactive-ion etching (RIE), electron-cyclotron-resonance (ECR) etching and inductively coupled plasma (ICP) etching have been developed to etch semiconductor devices having extremely small features sizes. By using the ICP technique it is possible to etch small diameter through-cavities such as through-holes with a very high aspect ratio and smooth surfaces in a substrate such as a silicon wafer.

The present invention is based on a novel approach, according to which a thin-film micro-electrochemical energy storage cell (MEESC) such as a DLC or a microbattery is created on a macroporous substrate, thus presenting increased capacity and performance. By using the substrate volume, an increase in the total electrode area per volume is accomplished. The cavities within a substrate are formed by deep wet or dry etching of the substrate. For example, holes may be formed by an Inductive Coupling Plasma (ICP) etching using the Bosch process described in U.S. Pat. No. 5,501,893.

SUMMARY OF THE INVENTION

It is an object of the present invention to provide a micro-electrochemical energy storage cell (MEESC) such as a DLC or a microbattery exhibiting superior performance as compared to such cells known in the art. A more particular object of the invention is to provide a DLC or a microbattery with up to two orders of magnitude increase in capacity.

The above objects are achieved by the present invention, wherein a thin-film MEESC is formed on a substrate having etched structures. The use of such a substrate increases the available area for thin film deposition, thus leading to an increase in volume, i.e. capacity of the cell.

Thus, the present invention provides a thin-film micro-electrochemical energy storage cell (MEESC) comprising two thin layer electrodes and intermediate to these electrodes, a thin layer of a solid electrolyte consisting of an ionically conducting or electronically non-conducting material such as glass, polymer electrolyte or polycrystalline material, and optionally a fourth thin current collector layer, all these layers being deposited in sequence on a surface of a substrate, wherein the MEESC is characterized in that the substrate is provided with a plurality of cavities with high aspect ratio; said electrodes, solid electrolyte and current collector layers being deposited also throughout the inner surface of said cavities and on both surfaces.

In a preferred embodiment the MEESC of the present invention is a thin film microbattery which comprises:

a thin layer anode consisting of alkali metal (M), alkali metal alloy, for example alkali metal alloy based on Zn, Al, Mg, or Sn or in the charged state consisting of lithiated carbon or graphite, a thin layer cathode consisting of $LiCoO_2$, $LiNiO_2$, $LiMn_2O_4$, $TiS_2$, $V_2O_5$, $V_3O_8$ or lithiated forms of the vanadium oxides, a solid electrolyte intermediate to the anode and cathode layers, which consists of a thin layer of an ionically conducting or electronically non-conducting material such as glass, polymer electrolyte or polycrystalline material, and optionally, a current collector layer; the anode or cathode layer being deposited on a surface of a substrate, the microbattery being characterized in that the substrate is provided with a plurality of cavities with high aspect ratio; said anode, cathode and solid electrolyte layers being deposited also throughout the inner surface of said holes.

In cases wherein the microbattery is a lithium ion type, such a battery is fabricated in the discharge state where the cathode is fully lithiated and the alloy, the carbon or the graphite anode is not charged with lithium.

According to another preferred embodiment, the MEESC of the present invention is a double-layer capacitor (DLC), which comprises two electrodes made of high surface area carbon powder and intermediate to these electrodes a solid electrolyte layer, preferably a polymer electrolyte.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
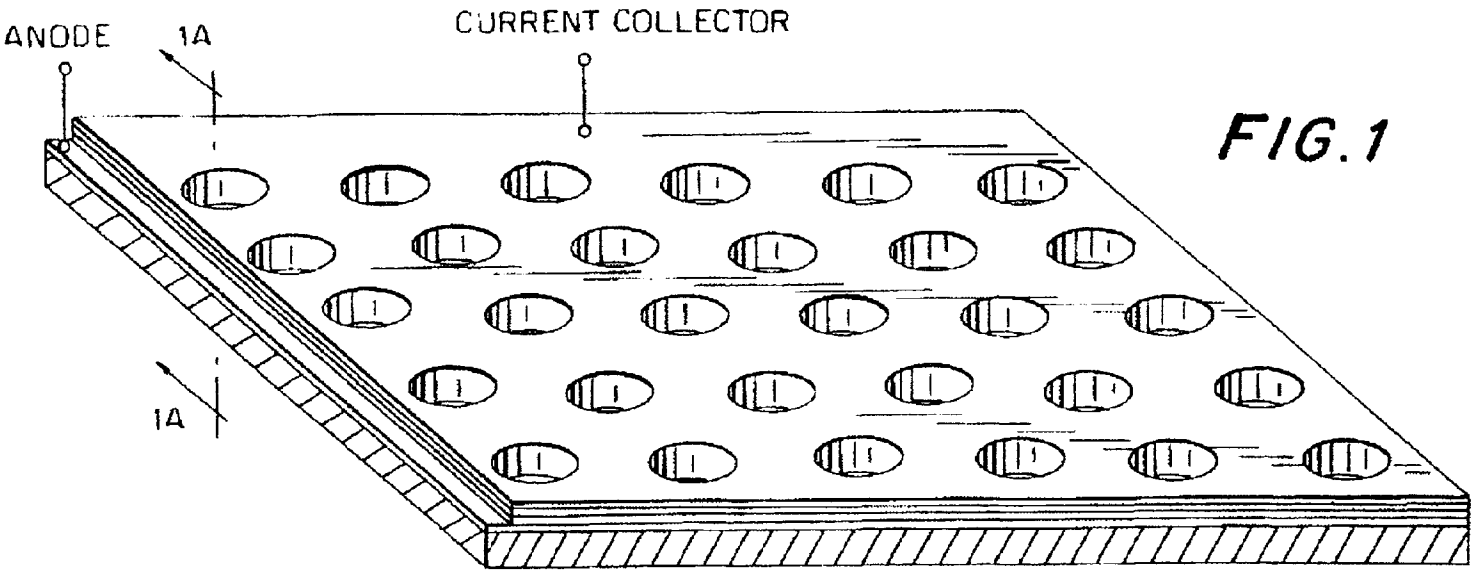
FIG. 1 is a schematic diagram of a thin-film microbattery coating a silicon wafer with through-holes.
Figure 1A:
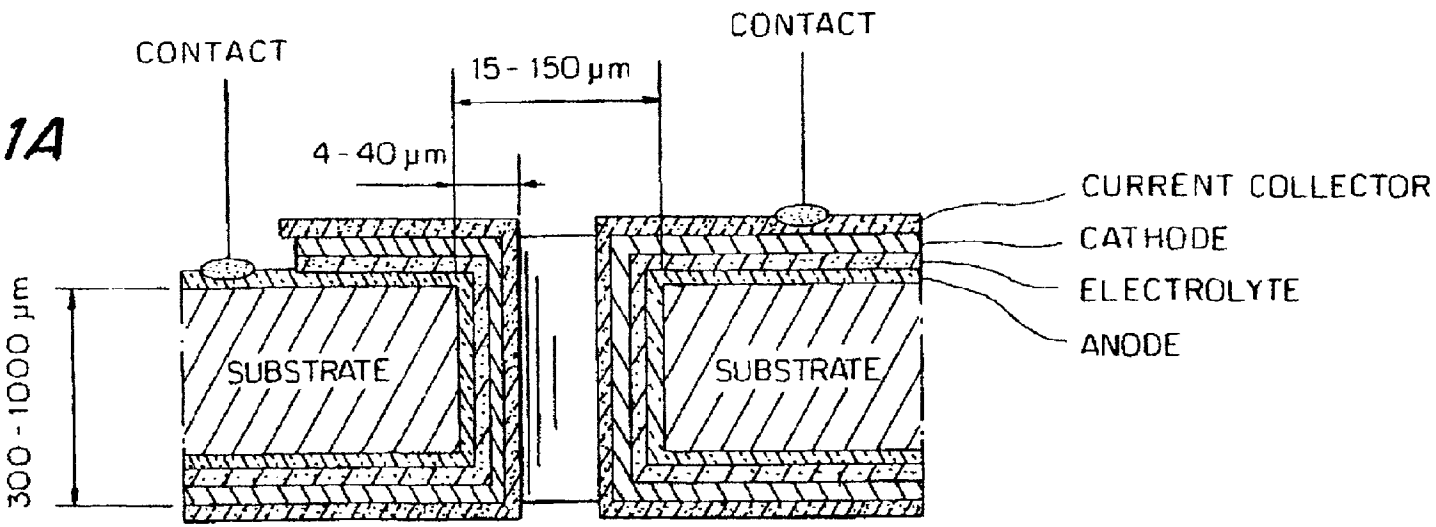

Thin-film rechargeable power sources can be applied for computer memory back-up and many other uses, such as autonomous micro electro-mechanical systems (MEMS). Lithium batteries have been brought recently to an extreme stage of miniaturization. Sequential gas phase deposition techniques of anode, electrolyte and cathode layers make it possible to incorporate such lithium batteries on a silicon substrate. In a chemical vapor deposition process gases and/or vapors react to form a solid compound. This reaction usually takes place after adsorption and partial decomposition of the precursors on the substrate surface, though reaction in the gas phase is possible.

The thin-film MEESC of the present invention consists of a sandwich of multiple layers, coating the inside of a through-cavity of arbitrary shape, formed in a substrate, for example by means of Inductive Coupled Plasma (ICP) etching when the substrate is made of silicon. Generally, the substrate material is made of a single crystal or amorphous material and is selected from glass, alumina, semiconductor materials for use in microelectronics, or ceramic materials. The substrate material is preferably silicon.

The through-cavities etched have very high aspect ratio and smooth surfaces, both features being essential for achieving uniform coating and an increase in the area available for thin-film deposition. The thin-film layers of the electrodes and electrolyte are deposited by either Chemical Vapor Deposition (CVD), casting or plating techniques. In CVD, gases providing the required materials will pass the cavity, undergo a chemical reaction induced by heat, plasma or a combination of the two, and deposit the material uniformly on the inside wall and between the cavities.

According to the present invention, for microbattery applications the polymer electrolyte is designed so as to contain at least one material that can be reduced to form an insoluble solid electrolyte interphase (SEI) on the anode surface. Aprotic solvents such as ethylene carbonate (EC), diethylcarbonate (DEC), dimethylcarbonate (DMC), ethyl methyl carbonate (EMC), butyl carbonate, propylene carbonate, vinyl carbonate, dialkylsulfites and any mixtures of these, and metal salts such as $LiPF_6$, $LiBF_4$, $LiAsF_6$, $LiCF_3$, and $LiN(CF_3SO_2)_2$ are considered to be good SEI precursors, as well as other salts such as LiI and LiBr. The polymer electrolyte further contains a polymer, preferably polyethylene oxide, adapted to form a complex with the metal salt and optionally a nanosize ceramic powder to form a composite polymer electrolyte (CPE).

While lithium metal foil is typically used for the negative electrode, the negative electrode is not specifically restricted as long as it comprises an electrically conductive film that provides alkali metal in a form effective for the electrode reaction. The preferred microbattery used in the present invention is a lithium ion type battery fabricated in the discharge state wherein the anode is made of Al, Sn, Zn, Mg based alloys, carbon or graphite. Lithium-ion cells made according to the present invention are air stable in the discharged state and are charged only after the assembly of the cell, thus being more favorable in terms of ease of production.

Similarly, the active substance of the positive electrode is not specifically restricted as long as it is of a type in which the metal ions, e.g. lithium ions are intercalated or inserted during discharge and taken out during charge of the battery. Inorganic compounds are typically employed, for example $LiCoO_2$, $LiNiO_2$, $LiMn_2O_4$, and lithiated vandium oxides for the lithium ion microbattery, while $FeS_2$ and $TiS_2$ can be used for the lithium metal anode microbattery. Fine powders of these compounds are cast together with the polymer electrolyte. In addition, it was found that where a composite polymer electrolyte, and/or a cathode contain up to 15% (V/V) of inorganic nanosize powder such as $Al_2O_3$, $SiO_2$, MgO, $TiO_2$ or mixtures thereof, the cell demonstrates improved charge-discharge performance.

For the DLC application additional salts can be used such as amonium and alkyl amonium salts. The DLC is made in a similar way as the microbattery: the electrodes are made in a same manner as the cathode layer in microbatteries, but the cathode powder is replaced by a high surface area (over 50 $m^2/g$) carbon.

FIG. 1 shows a possible cylindrical geometry implemented in a substrate, for example silicon, of a microbattery. The anode is made, in the charged state, of an alkali metal (M), alkali metal alloy or lithiated carbon. The preferred alkali metal is lithium and the preferred alloys are Al, Mg, Sn and Zn based alloys. The solid electrolyte is made of an ionically conducting glass, preferably $Li_xPO_yN_z$ where $2<x<3$, $2y=3z$ and $0.18<z<0.43$, or $Li_2S$-$SiS_2$ glasses doped with up to 5% $LiSO_4$ or 30% LiI, or a poly(ethylene oxide) based polymer electrolyte, preferably cross-linked poly (ethylene oxide) with $CF_3SO_3Li$ or $LiN(CF_3SO_2)_2$. The cathode is made of $LiCoO_2$, $LiNiO_2$, $LiMn_2O_4$, $TiS_2$, $V_2O_5$, $V_3O_{13}$ or the lithiated form of these vanadium oxides. The layers are deposited by CVD, plating, casting or similar known coating techniques, preferably by CVD. Contacts to the anode and cathode are made on either the same side of the wafer using masking, etching, and contact metal deposition, or using both sides of the wafer.

By etching the substrate with macroporous cavities of various shapes, the microbattery of the present invention has an increased area available for thin film deposition by up to 100 fold. Since the capacity of a battery is directly proportional to its volume, for the same thin-film thickness (typically a few microns for each layer of anode, electrode and cathode and up to a total of about 70 μm), means an increase in volume of up to about two orders of magnitude, i.e. capacity, to about 10,000 microAmp hour per 1 square cm.

For a circular cavity with diameter d in a wafer of thickness h ("aspect ratio"=b/d), the ratio k of surface area after etching to the original, "planar" state is 2 h/d. For a square cavity with side a in the same wafer, k=2 h/a. Thus, for a typical wafer with a thickness of 400 μm (e.g. h=400) and d or a=15 μm, the increase in area is: k=53, while for d=10 μm, k=80.

The invention will be further described in more detail with the aid of the following non-limiting examples.

EXAMPLE 1

A microbattery, consisting of a carbon anode, composite polymer electrolyte and composite $LiCoO_2$ cathode was fabricated in the discharged state on a perforated 400 micron thick silicon wafer which contains 100 micron in diameter through holes. A thin carbon film was deposited by CVD at 850 Celsius by passing a $C_2H_4$ (10%) Ar (90%) gas mixture for four minutes over the wafer.

A second layer of a composite polymer electrolyte (CPE) was deposited (inside an Ar filled glove box) over the carbon layer by a short vacuum dipping at 50–65 Celsius in acetonitrile (30 ml) suspension consisting of 0.6 g PEO ($5\times10^6$ MW), 0.05 g EC, 0.1 g $LiN(CF_3SO_2)_2$ (imide) and 0.03 g alumina. After drying, a second layer of CPE was deposited in the same way to get the desired CPE thickness. A thin cathode layer was deposited (inside the glove box) over the CPE layer by a short vacuum dipping in cyclopentanone (10 ml) suspension consisting of 2 g of ball milled $LiCoO_2$, 0.05 g alumina, 0.2 g PVDF copolymer (ELF 2800) and 0.4 g sub-micron graphite powder. As an option for improving cathode utilization and power capability, a forth PVDF-graphite layer is deposited on the cathode.

Figure 2:
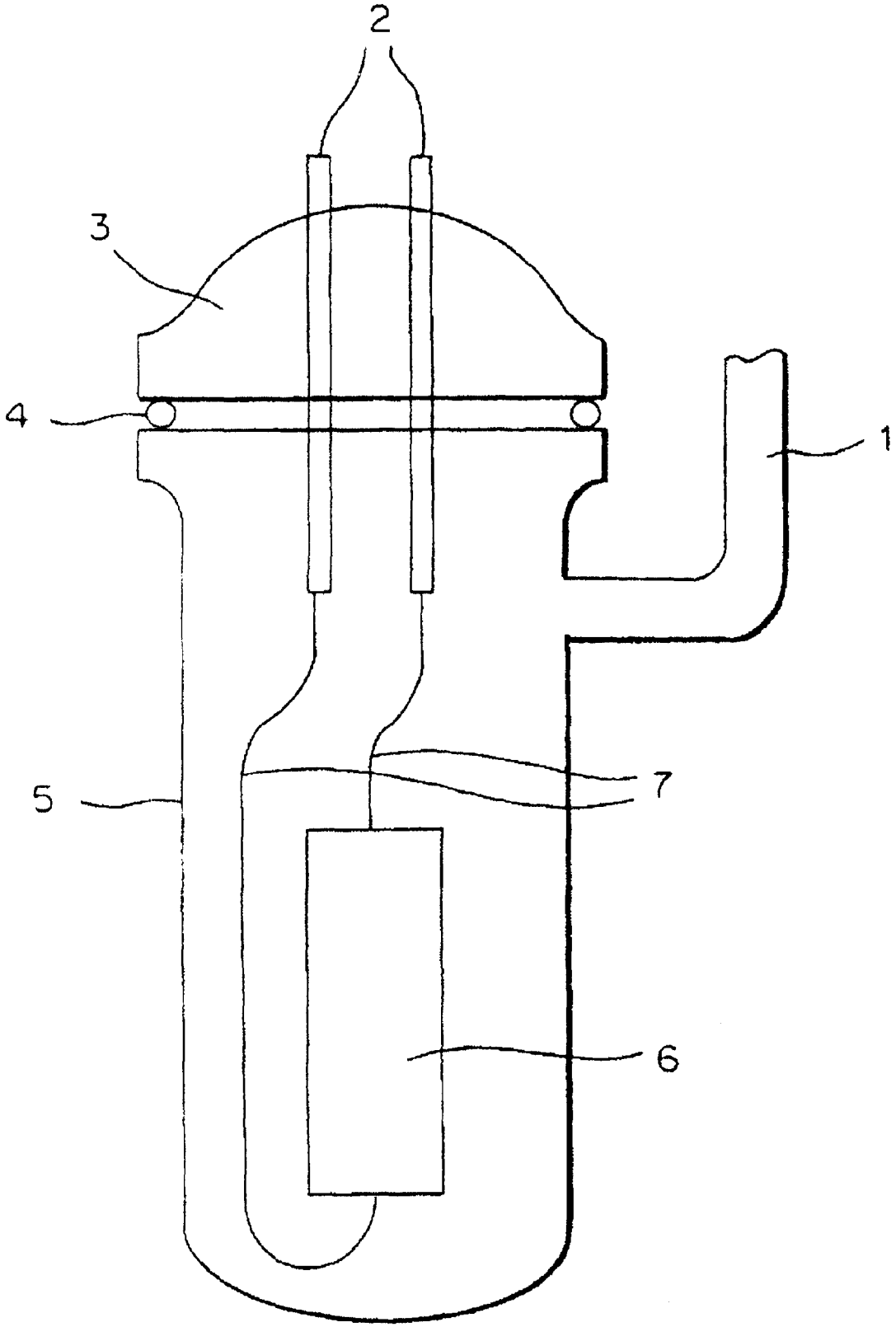
FIG. 2 is a schematic view of a test cell.

Poly(ethylene oxide)(P(EO)) was purchased from Aldrich, (average molecular weight $5\times10^6$) and was vacuum dried at 45° to 50° C. for about 24 hours. The imide (Aldrich) was vacuum dried at 200° C. for about 4 hours. All subsequent handling of these materials took place under an argon atmosphere in a VAC glove box with an water content<10 ppm. A polymer electrolyte slurry was prepared by dispersing known quantities of P(EO), imide, and ethylene carbonate (EC) in analytical grade acetonitrile together with the required amount of an inorganic filler, such as $Al_2O_3$ (Buehler), or $SiO_2$ with an average diameter of about 1.50Å. To ensure the formation of a homogeneous suspension, an ultrasonic bath or high-speed homogenizer was used. The suspension was stirred for about 24 hours before the composite cathode was cast. The solvent was allowed to evaporate slowly and then the wafers were vacuum dried at 120° C. for at least 5 hours. The electrochemical characteristics of the microbattery has been examined in the experimental cell showed in FIG. 2, which comprises a hermetically sealed glass container 5, provided with an outlet 1, connected to a vacuum pump; the glass cover 3 of the glass container is equipped with a Viton O-ring 4. On one side of the wafer a contact was made to the carbon anode and on the other side a contact was made to the cathode. The test cell illustrated in FIG. 2 is connected by wires 7 to tungsten rods 2 which pass through the cover. In the glass container, the battery 6 was cycled between 2.5 and 4.1 V at 0.01 mA and at 25° C. using a Maccor series 2000 battery test system.

The cell delivered above 0.4 mAh per cycle for over 20 cycles. The Faradaic efficiency was close to 100%.

EXAMPLE 2

A DLC, consisting of two carbon electrodes, and composite polymer electrolyte was fabricated on a perforated 400 micron thick silicon wafer which contains 100 micron in diameter through holes in a similar way as described in Example 1. A thin high surface area carbon powder (500 $m^2/g$) (made by 1000 Celsius pyrolysis of cotton) layer was deposited (inside the glove box) on the perforated wafer by a short vacuum dipping in cyclopentanone (10 ml) suspension consisting of 1 g of ball milled carbon, 0.05 g carbon black and 0.1 g PVDF copolymer (ELF 2800). A second layer of a composite polymer electrolyte (CPE) was deposited (inside Ar filled glove box) over the carbon layer by a short vacuum dipping at 50–65 Celsius in an acetonitrile (30 ml) suspension consisting of 0.6 g PEO ($5\times10^6$ MW), 0.05 g EC, 0.1 g $LiN(CF_3SO_2)_2$ (imide) and 0.03 g alumina. After drying, another layer of CPE was deposited in the same way to get the desired CPE thickness. A third high surface area carbon layer was deposited in the same way as the first one.

By using the procedure described in Example 1 above, the DLC was cycled at 0.01 mA between 1.2 and 2.5 V for over 1000 cycles of 10 seconds each.

EXAMPLE 3

A microbattery, consisting of four thin films: a carbon anode, Al doped $Li_2CO_3$ solid electrolyte, $LiCoO_2$ cathode and carbon current collector was fabricated in the discharged state on a perforated 400 micron thick silicon wafer which contains 60 micron in diameter through holes. A thin carbon film was CVD deposited at 850 Celsius by passing a $C_2H_4$ (10%) Ar (90%) gas mixture for three minutes over the wafer. A second layer of thin Al doped $Li_2CO_3$ solid electrolyte was deposited at 475 Celsius on the first one by CVD following the procedure described in P. Fragnaul et al. J. Power Sources 54, 362 1995. A third thin layer of $LiCoO_2$ cathode was deposited at 500 Celsius on the second one following the procedure described in P. Fragnaul et al. J. Power Sources 54, 362 1995. A fourth thin carbon current collector layer was deposited at 800 Celsius on the third one in the same way as the first one.

This cell was cycled (as described in example 1) at 0.01 mA and at room, temperature between 2.5 and 4.1 V for more than 10 stable cycles.

What is claimed is:

[1. A thin-film micro-electrochemical energy storage cell (MEESC) in the form of a microbattery, said microbattery comprising:

a substrate having two surfaces, a thin layer anode consisting of alkali metal (M), alkali metal alloy or in the charged state consisting of lithiated carbon or graphite, a thin layer cathode consisting of $LiCoO_2$, $LiNiO_2$, $LiMn_2O_4$, $TiS_2$, $V_2O_5$, $V_3O_8$ or lithiated forms of the vanadium oxides, a solid electrolyte intermediate to said anode and cathode layers, consisting of a tin layer of an ionically conducting or electronically non-conducting material selected from glass, poly(ethylene oxide) based polymer electrolyte or polycrystalline material, and optionally, a fourth current collector layer;

said anode or cathode layer being deposited in sequence on both surfaces of said substrate, said microbattery being characterized in that the substrate is provided with a plurality of through cavities of arbitrary shape, with an aspect ratio greater than 1, the diameter of said cavities being from about 15μ to about 150μ; said anode, cathode, solid electrolyte layers and optional current collector layer being also deposited throughout the inner surface of said cavities.]

[2. The microbattery of claim 1, wherein the substrate is made of a single crystal or amorphous material.]

[3. The microbattery of claim 2, wherein the substrate material is selected from the group consisting of glass, alumina, semiconductor materials for use in microelectronics and ceramic materials.]

[4. The microbattery of claim 3, wherein the substrate material is made of silicon.]

[5. The microbattery of claim 1, wherein the alkali metal (M) which forms the anode is lithium.]

[6. A lithium ion type microbattery according to claim 1, being fabricated in the discharge state where the cathode is fully lithiated and the alloy, carbon or graphite anode is not charged with lithium.]

[7. The microbattery of claim 1, wherein the through cavities of the substrate are formed by Inductive Coupled Plasma etching.]

[8. The microbattery of claim 1, wherein the through cavities of the substrate have an aspect ratio of between about 2 to about 50.]

[9. The microbattery of claim 1, wherein said cavities have a cylindrical geometry.]

[10. The microbattery of claim 1, wherein the solid electrolyte is a polymer electrolyte based on poly(ethylene oxide) and $CF_3SO_3Li$, $(CF_3SO_2)_2NLi$, or mixtures thereof.]

[11. The microbattery of claim 1, wherein the solid electrolyte is selected from $Li_xPO_yN_z$ where $2<x<3$, $2y=3z$ and $0.18<z<0.43$, or $LiS\text{-}SiS_2$ glasses doped with up to 5% $LiSO_4$ or 30% LiI.]

[12. The microbattery of claim 1, wherein the solid electrolyte is a polymer electrolyte and it comprises between about 2 to about 15% (V/V) high surface area of inorganic, nanosize particles of ceramic powder which consists of $Al_2O_3$, $SiO_2$, MgO, $TiO_2$ or mixtures thereof.]

[13. The microbattery of claim 1, wherein the solid electrolyte comprises $Li_2CO_3$ doped with up to about 10% (% atomic weight relative to Li) of Ca, Mg, Ba, Sr, Al or B.]

[14. A self-powered semiconductor component comprising a microbattery according to claim 2.]

*15. A method for fabrication of an energy storage cell, comprising:*

*providing a substrate having two surfaces and including a plurality of through cavities extending between said two surfaces; and*

*depositing thin film layers over said two surfaces and throughout an inner surface of said cavities, said thin film layers comprising an anode layer, a cathode layer, and an electrolyte intermediate to said anode and cathode layers.*

*16. The method according to claim 15 and wherein said substrate comprises a single crystal substrate.*

*17. The method according to claim 16 and wherein said single crystal substrate comprises a silicon substrate.*

*18. The method according to claim 15 and wherein said substrate comprises an amorphous material.*

*19. The method according to claim 15 and wherein said substrate comprises a material selected from the group consisting of glass, alumina, semiconductors and ceramic materials.*

*20. The method according to claim 15 and wherein said anode layer comprises at least one material selected from the group consisting of an alkali metal, an alkali metal alloy, carbon and graphite.*

*21. The method according to claim 20 and wherein said alkali metal comprises lithium.*

*22. The method according to claim 15 wherein depositing said thin film layers comprises fabricating said thin film layers in a discharge state wherein said cathode layer is fully lithiated.*

*23. The method according to claim 22 and wherein said metal alloy is not charged with lithium.*

*24. The method according to claim 22 and wherein said carbon and said graphite are not charged with lithium.*

*25. The method according to claim 15 and wherein said electrolyte comprises a polymer electrolyte.*

*26. The method according to claim 15 and wherein said electrolyte comprises at least one material selected from the group consisting of glass, a polyethylene oxide based polymer, a polycrystalline material, ethylene carbonate (EC), diethylcarbonate (DEC), dimethylcarbonate (DMC), ethyl methyl carbonate (EMC), butyl carbonate, propylene carbonate, vinyl carbonate, dialkylsulfites, $LiPF_6$, $LiBF_4$, $LiAsF_6$, $LiCF_3$, $LiN(CF_3SO_2)_2$, LiI and LiBr.*

*27. The method according to claim 15 and wherein said electrolyte is selected from $Li_xPO_yN_z$ wherein $2<x<3$, $2y=3z$ and $0.18<z<0.43$, or $LiS_2\text{-}SiS_2$ glasses doped with up to 5% $LiSO_4$ or 30% LiI.*

*28. The method according to claim 15 and wherein said anode layer comprises a lithium metal foil.*

*29. The method according to claim 15 and wherein said cathode layer comprises at least one material selected from the group consisting of $LiCoO_2$, $LiNiO_2$, $LiMn_2O_4$, $TiS_2$, $V_2O_5$, $V_3O_{13}$, the lithiated form of $V_2O_5$ and the lithiated form of $V_3O_{13}$.*

*30. The method according to claim 15 and wherein depositing said thin film layers comprises depositing at least one PVDF-graphite layer on said cathode layer.*

*31. The method according to claim 15 and wherein said anode layer and said cathode layer comprise carbon.*

*32. The method according to claim 31 and wherein said electrolyte comprises a polymer electrolyte.*

*33. The method according to claim 15 wherein depositing said thin film layers further comprises depositing a current collector layer.*

*34. The method according to claim 33 and wherein said current collector layer is deposited over said anode layer, said electrolyte, and said cathode layer.*

* * * * *